(12) United States Patent
Utsumi et al.

(10) Patent No.: US 10,600,872 B2
(45) Date of Patent: Mar. 24, 2020

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki-shi, Kanagawa (JP)

(72) Inventors: Makoto Utsumi, Matsumoto (JP); Yasuhiko Oonishi, Matsumoto (JP); Fumikazu Imai, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/938,481

(22) Filed: Mar. 28, 2018

(65) Prior Publication Data

US 2018/0301536 A1    Oct. 18, 2018

(30) Foreign Application Priority Data

Apr. 12, 2017 (JP) ................................. 2017-079316

(51) Int. Cl.
*H01L 29/16* (2006.01)
*H01L 29/78* (2006.01)
(Continued)

(52) U.S. Cl.
CPC ...... *H01L 29/1608* (2013.01); *H01L 21/0206* (2013.01); *H01L 21/02236* (2013.01);
(Continued)

(58) Field of Classification Search
CPC .......... H01L 29/1608; H01L 29/66053; H01L 29/6606; H01L 29/66068; H01L 29/78684;
(Continued)

(56) References Cited

U.S. PATENT DOCUMENTS

| 6,136,727 A | 10/2000 | Ueno |
| 2011/0309376 A1 | 12/2011 | Hiyoshi et al. |

(Continued)

FOREIGN PATENT DOCUMENTS

| JP | H11-186256 A | 7/1999 |
| JP | 3733792 B2 | 1/2006 |
| JP | 2012-004270 A | 1/2012 |

OTHER PUBLICATIONS

Ryota Okamoto et al., "Atomic-scale analysis of 4 H—SiC (0001) surface after wet-chemical preparations", 2006 Japan Society for Precision Engineering, Autumn Meeting Presented Papers Collection, pp. 539-540; Translation of the relevant part: p. 539 entirely and on p. 540, last 5 lines of left column and first 7 lines of right column.

*Primary Examiner* — Tucker J Wright
*Assistant Examiner* — Scott Stowe
(74) *Attorney, Agent, or Firm* — Rabin & Berdo, P.C.

(57) ABSTRACT

A silicon carbide semiconductor device includes a silicon carbide semiconductor substrate of a first conductivity type, a first silicon carbide layer of the first conductivity type, and an insulating film. In the silicon carbide semiconductor device, no fluorine or chlorine is detectable in the insulating film, at a boundary layer of the insulating film and the first silicon carbide layer, or at the surface of first silicon carbide layer where the insulating film is provided.

5 Claims, 8 Drawing Sheets

(51) Int. Cl.
*H01L 29/423* (2006.01)
*H01L 29/66* (2006.01)
*H01L 21/02* (2006.01)
*H01L 21/04* (2006.01)
*H01L 29/872* (2006.01)
*H01L 29/51* (2006.01)
*H01L 29/06* (2006.01)
*H01L 29/10* (2006.01)
*H01L 29/36* (2006.01)
*H01L 29/167* (2006.01)

(52) U.S. Cl.
CPC .. *H01L 21/02255* (2013.01); *H01L 21/02378* (2013.01); *H01L 21/02529* (2013.01); *H01L 21/02634* (2013.01); *H01L 21/049* (2013.01); *H01L 21/0475* (2013.01); *H01L 21/0495* (2013.01); *H01L 29/0619* (2013.01); *H01L 29/0623* (2013.01); *H01L 29/1095* (2013.01); *H01L 29/4236* (2013.01); *H01L 29/51* (2013.01); *H01L 29/6606* (2013.01); *H01L 29/66068* (2013.01); *H01L 29/7811* (2013.01); *H01L 29/7813* (2013.01); *H01L 29/872* (2013.01); *H01L 21/046* (2013.01); *H01L 29/0615* (2013.01); *H01L 29/0638* (2013.01); *H01L 29/167* (2013.01); *H01L 29/36* (2013.01)

(58) Field of Classification Search
CPC ........... H01L 21/0206; H01L 21/02236; H01L 21/02255; H01L 21/02634; H01L 21/0475; H01L 21/049; H01L 21/0495
See application file for complete search history.

(56) References Cited

U.S. PATENT DOCUMENTS

| | | | |
|---|---|---|---|
| 2013/0045592 A1* | 2/2013 | Miyazaki | H01L 21/02046 438/514 |
| 2018/0233574 A1 | 8/2018 | Morisette et al. | |
| 2019/0019868 A1 | 1/2019 | Wada et al. | |

* cited by examiner

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2017-079316, filed on Apr. 12, 2017, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

A silicon carbide (SiC) semiconductor material has a high dielectric field strength and therefore, use of silicon carbide as a material in next generation power semiconductor devices having low loss is expected. Silicon carbide semiconductor devices having various types of structures such as Schottky barrier diodes, metal oxide semiconductor field effect transistors (MOSFET), etc. have been developed. In general, among MOSFETs, a trench type having a gate electrode in a trench that is nearly vertical to a surface of a substrate enables the cell density per unit area to be increased more than the cell density per unit area in a planar type having a gate electrode on the surface of the substrate and thus, the trench type enables the current density to be increased and demands for large current to be met.

In fabrication (manufacturing) processes of these silicon carbide semiconductor devices, processes similar to those for a silicon (Si) semiconductor device are often used because of the ease of applying knowhow and manufacturing equipment. In the cleaning process, wet cleaning is applied using a strong acid and highly basic solution (so-called RCA) combining a mixture of ammonia ($NH_3$) water and a hydrogen peroxide solution ($H_2O_2$) (Standard Clean 1 (SC1)), a mixture of hydrochloric acid (HCl) and a hydrogen peroxide solution (Standard Clean 2 (SC29), and a dilute hydrofluoric acid (HF) (for example, refer to Japanese Laid-Open Patent Publication No. 2012-4270).

In a trench silicon carbide semiconductor device, formation of an oxide film having a uniform thickness on an inner surface of the trench is necessary and therefore, a deposited film such as that formed by a high temperature oxide (HTO) using silane gas is used rather than an oxide formed by thermal oxidation. Further, as a surface processing method of a silicon carbide semiconductor substrate, a technique has been disclosed in which etching is performed by a plasma process and using hydrogen ($H_2$) (for example, refer to Japanese Patent No. 3733792 and Japanese Laid-Open Patent Publication No. H11-186256).

SUMMARY OF THE INVENTION

According to an embodiment of the present invention, a silicon carbide semiconductor device includes a silicon carbide semiconductor substrate of a first conductivity type; a first silicon carbide layer of the first conductivity type provided on a front surface of the silicon carbide semiconductor substrate; and an insulating film selectively provided on a surface of the first silicon carbide layer. No fluorine or chlorine is detectable in the insulating film, at a boundary layer of the insulating film and the first silicon carbide layer, or at the surface of the first silicon carbide layer where the insulating film is provided.

According to an embodiment of the present invention, a silicon carbide semiconductor device includes a silicon carbide semiconductor substrate of a first conductivity type; a first silicon carbide layer of the first conductivity type provided on a front surface of the silicon carbide semiconductor substrate; a second silicon carbide layer of a second conductivity type selectively provided in a first surface of the first silicon carbide layer, the first surface opposite a second surface of the first silicon carbide layer facing the silicon carbide semiconductor substrate; and a gate insulating film provided on a surface of the second silicon carbide layer. No fluorine or chlorine is detectable in the gate insulating film, at a boundary layer of the gate insulating film and the second silicon carbide layer, or at the surface of the second silicon carbide layer where the gate insulating film is provided. According to an embodiment of the present invention, a silicon carbide semiconductor device includes a silicon carbide semiconductor substrate of a first conductivity type; a first silicon carbide layer of the first conductivity type provided on a front surface of the silicon carbide semiconductor substrate; a second silicon carbide layer of the first conductivity type selectively provided in a first surface of the first silicon carbide layer, the first surface opposite a second surface of the first silicon carbide layer facing the silicon carbide semiconductor substrate; a third silicon carbide layer of a second conductivity selectively provided on a first surface of the second silicon carbide layer, the first surface of the second silicon carbide layer opposite a second surface of the second silicon carbide layer facing toward the first silicon carbide layer; a trench at least penetrating the third silicon carbide layer and reaching the second silicon carbide layer; and a gate insulating film provided on a surface of the trench. No fluorine or chlorine is detectable in the gate insulating film, at a boundary layer of the gate insulating film and the second silicon carbide layer, or at the surface of the second silicon carbide layer where the gate insulating film is provided.

In the embodiments, no fluorine or chlorine is detectable means a converted concentration of fluorine and chlorine is less than $1 \times 10^{17}$ atoms/cm$^3$.

In the embodiments, no fluorine or chlorine is detectable means a converted concentration of fluorine and chlorine by Time Of Flight Secondary Ion Mass Spectrometry is less than $1 \times 10^{17}$ atoms/cm$^3$.

According to an embodiment of the present invention, a method of manufacturing a silicon carbide semiconductor device includes forming a first silicon carbide layer of a first conductivity type on a front surface of a silicon carbide semiconductor substrate; forming a thermal oxidation film on a surface of a base body including the first silicon carbide layer; removing the thermal oxidation film by a solution containing hydrofluoric acid; washing the base body with a mixture of ammonia water and a hydrogen peroxide solution, a mixture of hydrochloric acid and a hydrogen peroxide solution, and a dilute hydrofluoric acid; holding the base body at a temperature of 700 degrees C. to 1000 degrees C. in a reduced-pressure atmosphere; and depositing an insulating film on the base body.

According to an embodiment of the present invention, a method of manufacturing a silicon carbide semiconductor device includes forming a first silicon carbide layer of a first conductivity type on a front surface of a silicon carbide semiconductor substrate; forming a thermal oxidation film on a surface of a base body including the first silicon carbide layer; removing the thermal oxidation film by a solution containing hydrofluoric acid; washing the base body with a mixture of ammonia water and a hydrogen peroxide solution, a mixture of hydrochloric acid and a hydrogen peroxide solution, and a dilute hydrofluoric acid; holding the base body at a temperature of 700 degrees C. to 1000 degrees C. in a hydrogen atmosphere; and depositing an insulating film on the base body.

According to an embodiment of the present invention, a method of manufacturing a silicon carbide semiconductor device includes forming a first silicon carbide layer of a first conductivity type on a front surface of a silicon carbide semiconductor substrate; forming a thermal oxidation film on a surface of a base body including the first silicon carbide layer; removing the thermal oxidation film by a solution containing hydrofluoric acid; washing the base body with a mixture of ammonia water and a hydrogen peroxide solution, a mixture of hydrochloric acid and a hydrogen peroxide solution, and a dilute hydrofluoric acid; holding the base body at temperature of 700 degrees C. to 1700 degrees C. in a mixed gas atmosphere containing hydrogen and silane; and depositing an insulating film on the base body.

Objects, features, and advantages of the present invention are specifically set forth in or will become apparent from the following detailed description of the invention when read in conjunction with the accompanying drawings.

DETAILED DESCRIPTION OF THE INVENTION

Problems related to the conventional techniques will be discussed. While hydrofluoric acid is widely used, it has been reported that when used on the surface of the silicon carbide semiconductor material, fluorine (F), which is a cleaning liquid component, has a residual property, for example, refer to Okamoto, Ryota, et al, "Atomic-scale analysis of 4H—SiC (0001) surface after wet-chemical preparations", 2006 Japan Society for Precision Engineering, Autumn Meeting Presented Papers Collection, pp. 539 to 540). Further, the inventors found that when RCA cleaning is used, chlorine and fluorine remains on the surface of the silicon carbide semiconductor material. In particular, it was found that in a trench silicon carbide semiconductor device, cleaning solution and/or rinsing solution in the trenches cannot be sufficiently circulated, whereby fluorine and chlorine from inside the trenches tends to be detected at higher concentrations than outside the trenches. Fluorine and chlorine were further detected from trench side surfaces constituting channel surfaces.

Further, since a high-temperature oxide film is used as an oxide film on the inner surface of the trenches, elements such as residual fluorine on the trench surface tend to easily remain at an interface of the trench surface and the deposited film. It is presumed that these elements are not only taken into the silicon carbide of the channel part and the gate oxide film by heat treatment at a subsequent process but also are taken into the passivation film of the element outer peripheral part, whereby an impurity state is formed.

Further, in a method using plasma as a surface processing method, it is presumed that not only the impurity of the surface of the silicon carbide but also the silicon carbide itself is removed by physical impact, forming dangling bonds, vacancies, etc., and an interface state. Further, with heat treatment in a hydrogen atmosphere as a surface processing method, it is presumed that rearrangement of the constituent elements of the silicon carbide occurs due to the temperature, dangling bonds and vacancies are formed by insufficient mobility, and an interface state is formed.

It is presumed that due to these impurities of fluorine and chlorine as well as the impurity state and the interface state, carrier mobility of the silicon carbide semiconductor device decreases, leading to an irregular decrease of the breakdown voltage.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
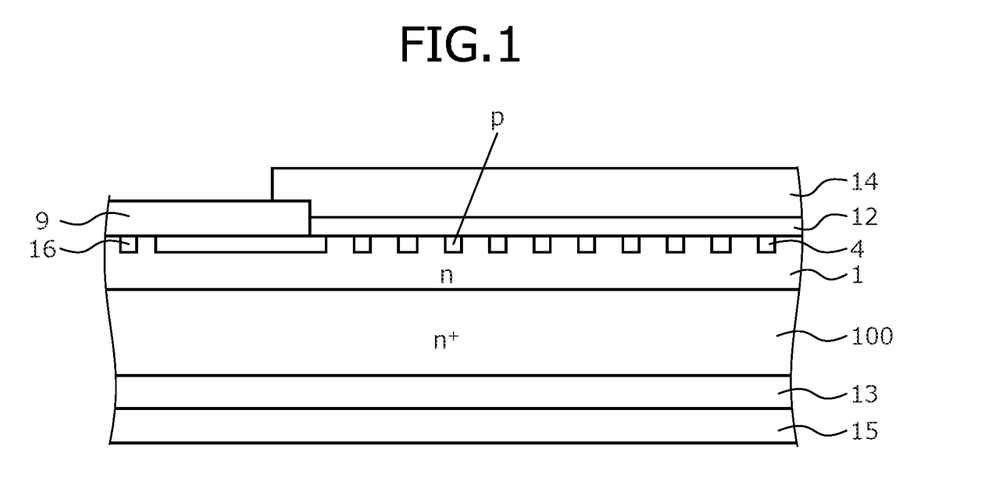
FIG. 1 is a cross-sectional view of a part of a configuration of a silicon carbide semiconductor device according to a first embodiment.

A semiconductor device according to the present invention will be described using, as an example, a silicon carbide semiconductor device fabricated using silicon carbide (SiC) as a wide bandgap semiconductor material. The silicon carbide semiconductor device will be described taking a silicon carbide semiconductor Schottky barrier diode as an example. FIG. 1 is a cross-sectional view of a part of a configuration of the silicon carbide semiconductor device according to a first embodiment.

As depicted in FIG. 1, in the silicon carbide semiconductor device according to the first embodiment, an n-type silicon carbide layer (first silicon carbide layer of the first conductivity type) 1 is provided on a first main surface, for example, (0001) plane (Si face), of an $n^+$-type silicon carbide semiconductor substrate (silicon carbide semiconductor substrate of a first conductivity type) 100.

The n+-type silicon carbide semiconductor substrate 100 is a silicon carbide single-crystal substrate doped with an n-type impurity such as nitrogen (N). The n-type silicon carbide layer 1 is a low-concentration n-type drift layer doped with an n-type impurity such as nitrogen. An impurity concentration of the n-type silicon carbide layer 1 is lower than an impurity concentration of the n+-type silicon carbide semiconductor substrate 100. A thickness of the n-type silicon carbide layer 1 varies according to the device breakdown voltage and a thickness from about 3 μm to 100 μm is used.

In a first main surface of the n-type silicon carbide layer 1 (first surface of the n-type silicon carbide layer 1 opposite a second surface thereof, the second surface facing the n+-type silicon carbide semiconductor substrate 100), a p-type ion implant layer 4 for increasing the breakdown voltage is provided. Further, in an edge termination structure region in an outer periphery, a p-type ion implant layer (not depicted) is provided, and an edge termination structure such as a junction termination extension (JTE) structure, a guard ring structure, etc. is formed. In an outer periphery of the p-type ion implant layer, a channel stopper 16 is provided.

Further, an insulating film 9 is provided on a surface of the n-type silicon carbide layer 1. Here, before formation of the insulating film 9, an impurity (fluorine, chlorine) of the n-type silicon carbide layer 1 is removed by the method of manufacturing as described in detail hereinafter. Therefore, the impurity (fluorine, chlorine (Cl)) is not detected in the insulating film 9, or in a boundary layer of the insulating film 9 and the n-type silicon carbide layer 1, or from the surface of the n-type silicon carbide layer 1 where the insulating film 9 is provided.

In a contact hole of the insulating film 9, a contact (Schottky barrier contact) electrode 12 is provided. The contact electrode 12 is in contact with the n-type silicon carbide layer 1 and the p-type ion implant layer 4, via the contact hole opened in the insulating film 9. On the contact electrode 12, an electrode pad 14 is provided.

On a second main surface (the second surface opposite the first main surface on which the n-type silicon carbide layer 1 is formed) of the n+-type silicon carbide semiconductor substrate 100, a rear electrode 13 and a rear electrode pad 15 are provided.

Figure 2:
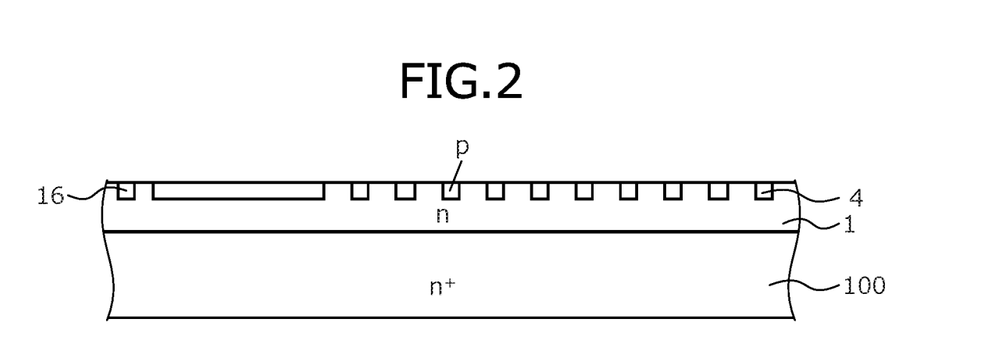
FIGS. 2, 3, and 4 are cross-sectional views of the silicon carbide semiconductor device according to the first embodiment during manufacture.
Figure 3:
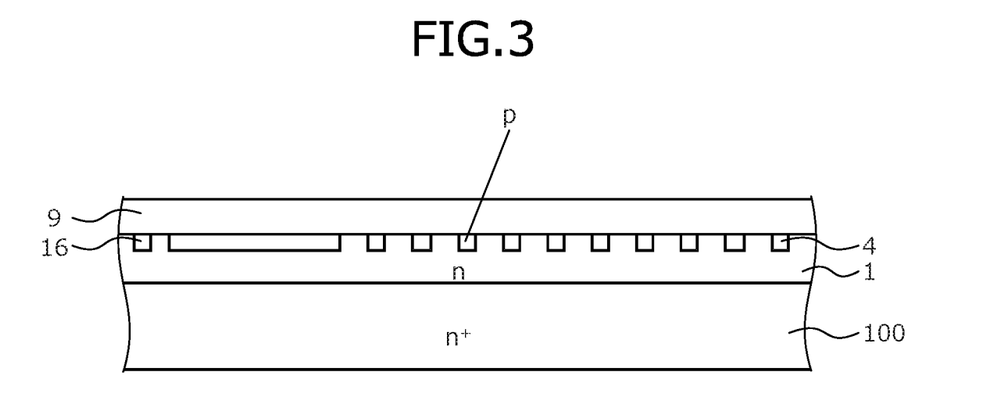
Figure 4:
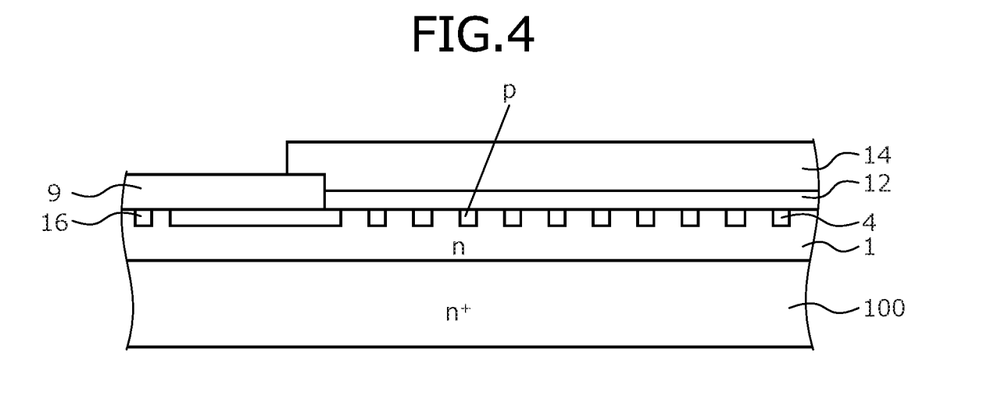

The method of manufacturing the silicon carbide semiconductor device according to the first embodiment will be described taking, as an example, a case in which a silicon carbide semiconductor Schottky barrier diode is fabricated. FIGS. 2, 3, and 4 are cross-sectional views of the silicon carbide semiconductor device according to the first embodiment during manufacture. First, the n+-type silicon carbide semiconductor substrate 100 doped with nitrogen is prepared. Next, on the n+-type silicon carbide semiconductor substrate 100, the n-type silicon carbide layer 1 doped with nitrogen is formed by epitaxial growth.

Next, an oxide film mask for ion implantation is formed by photolithography and etching, and the p-type ion implant layer 4 is selectively formed in a surface layer of the n-type silicon carbide layer 1 by ion implantation. In this ion implantation, for example, a dose may be set so that an impurity concentration of the p-type ion implant layer 4 is from $1\times10^{16}/cm^3$ to $1\times10^{20}/cm^3$. Further, an ion implantation depth of the p-type ion implant layer 4 may be at maximum about 0.7 μm, which enables recovery of crystal defects by heat treatment.

Next, an oxide film mask for ion implantation is formed by photolithography and etching, and a p-type ion implant layer (not depicted) is further provided selectively in the edge termination structure region by ion implantation. In this ion implantation, for example, the edge termination structure such as a JTE structure or guard ring is formed to have an implantation depth of about 0.7 μm and an impurity concentration of about $1\times10^{16}/cm^3$ to $1\times10^{19}/cm^3$.

Next, an oxide film mask for ion implantation is formed by photolithography and etching, and the channel stopper 16 is selectively formed by ion implantation. In the ion implantation, an n-type region is formed by implanting phosphorus (P) ions or nitrogen ions. A p-type region is formed by implanting aluminum ions. The structure formed up to here is depicted in FIG. 2.

Next, the n+-type silicon carbide semiconductor substrate 100 is subjected to activation annealing at a temperature of about 1700 degrees C. and then, a sacrificial oxide film (not depicted) is formed on a surface of a base body that includes the n-type silicon carbide layer 1 formed on the n+-type silicon carbide semiconductor substrate 100. Next, the sacrificial oxide film is removed by hydrofluoric acid. As a result, a damage layer and impurities such as metal on the surface of the n-type silicon carbide layer 1 are removed. Next, the base body is cleaned (RCA cleaning) using a mixture of ammonia water and a hydrogen peroxide solution, a mixture of hydrochloric acid and a hydrogen peroxide solution, and a dilute hydrofluoric acid.

The surface of the base body subjected to the RCA cleaning is covered by fluorine, chlorine, a hydroxyl group (—OH), etc. and therefore, when a silicon oxide film is formed by thermal oxidation, fluorine and chlorine tends to be taken in more in the oxide film rather than a boundary portion. These elements form an impurity state in the insulating film and in particular, cause problems such as decreases in the breakdown voltage in a reliability test.

As method of removing these elements, in the first embodiment, a process is performed in which the base body is held at a temperature of 700 degrees C. to 1000 degrees C. in a reduced-pressure atmosphere, whereby the elements are eliminated from the surface. Further, a process is performed in which the base body is held at a temperature of 700 degrees C. to 1000 degrees C. in a hydrogen atmosphere, whereby fluorine and chlorine of the surface are eliminated as hydrogen fluoride and hydrogen chloride (HCl) and the silicon carbide surface is hydrogen terminated. Further, a process is performed in which the base body is held at a temperature of 700 degrees C. to 1700 degrees C. in a mixed gas atmosphere including hydrogen and silane (SiH4), whereby fluorine and chlorine are eliminated as hydrogen fluoride and hydrogen chloride and surface diffusion is utilized to reduce vacancies, etc. of the silicon carbide surface while the silicon carbide surface is hydrogen terminated. These processes may all be performed. At least one of the processes suffices to be performed. After at least one of these processes is performed, the insulating film 9 is formed by thermal oxidation or a deposition method. The structure formed up to here is depicted in FIG. 3.

Figure 5:
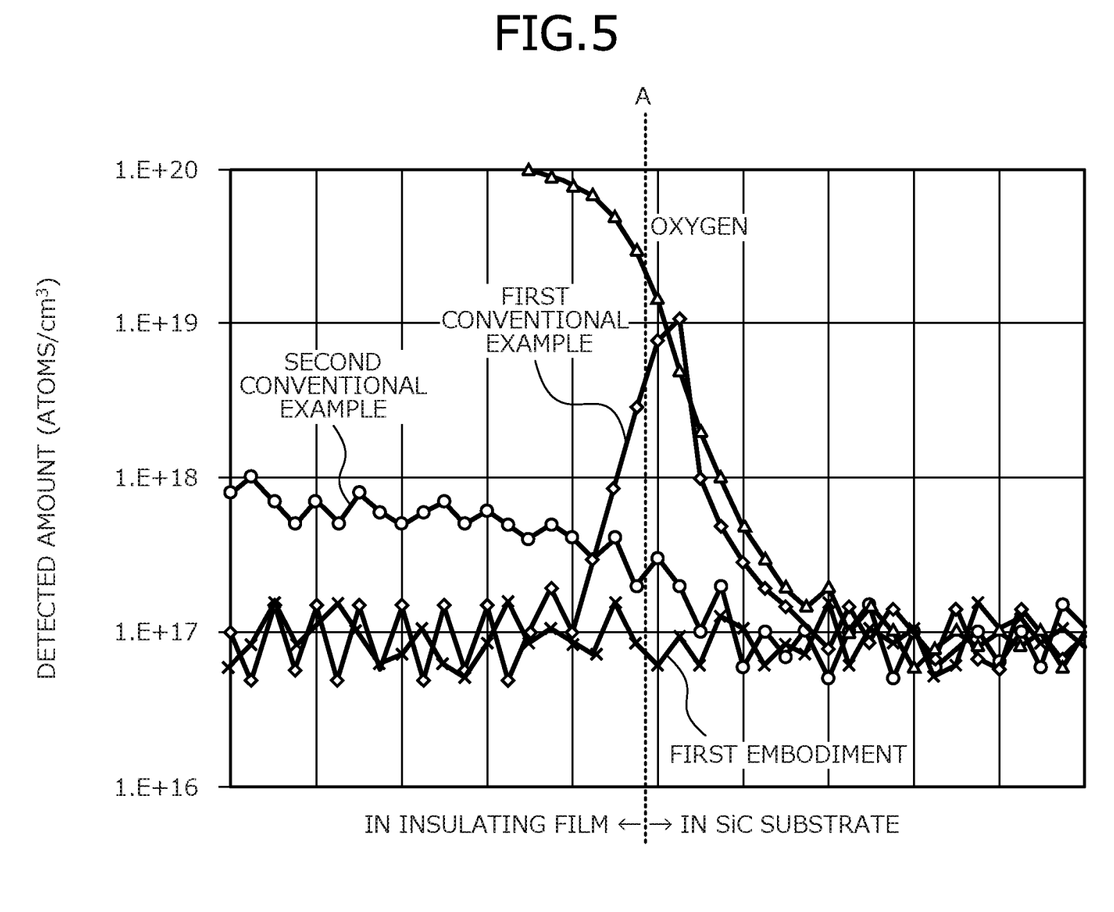
FIG. 5 is a graph of surface analysis results of the silicon carbide semiconductor device according to the first embodiment.

In the case where the base body is held in a reduced-pressure atmosphere, although the elimination of fluorine and chlorine is facilitated by setting the temperature to 700 degrees C. or higher, oxidation of the surface of the n-type silicon carbide layer 1 (first n-type silicon carbide layer) progresses and therefore, the temperature may be set to be 1000 degrees C. or less. The temperature may be further set to a range from 750 degrees C. to 900 degrees C. When the base body is held in a hydrogen atmosphere, although setting the temperature to 700 degrees C. or higher converts fluorine and chlorine of the surface to hydrogen fluoride and hydrogen chloride and facilitates elimination, the temperature may be set to be 1000 degrees C. or less to suppress etching of the surface of the n-type silicon carbide layer 1. The temperature may be further set to a range from 800 degrees C. to 900 degrees C. When a mixed gas atmosphere including hydrogen and silane is used, the silane concentration may be from 0.1 to 1.0 volume %. When the silane concentration is higher than this concentration, the deposition of silicon (Si) to the surface of the n-type silicon carbide layer 1 clearly appears. The removal of fluorine and chlorine is observed from 700 degrees C. or higher, and to suppress excess surface diffusion such as step bunching formation, the temperature may be 1700 degrees C. or less. The temperature range may be from 1300 degrees C. to 1600 degrees C. Table 1 shows TOF-SIMS analysis results of peak concentrations of chlorine and fluorine for each of the processes. An intensity of a sample for which preprocessing was not performed is assumed to be 1.

elements (such as fluorine attached to the surface) by cleaning. Further, a second conventional example in FIG. 5 is an example of a case where the insulating film 9 is formed by thermal oxidation and the insulating film 9 is formed without removing elements (such as fluorine attached to the surface) by cleaning. As depicted in FIG. 5, in the first and second conventional examples, fluorine from inside the insulating film 9 was detected at a converted concentration of $1 \times 10^{17}$ atoms/cm$^3$ or higher. In particular, when the insulating film 9 was formed by a deposition method (the first conventional example), fluorine from the interface of the insulating film 9 and the n-type silicon carbide layer 1 was detected at a high concentration of $1 \times 10^{19}$ atoms/cm$^3$ or more (converted concentration). In contrast, for the first embodiment in which the process of removing surface-attached fluorine, etc. by cleaning is introduced, as depicted in FIG. 5, neither fluorine nor chlorine from inside the insulating film 9 or from the interface of the insulating film 9 and the n-type silicon carbide layer 1 was detected, and is

TABLE 1

| | | 600° C. | 700° C. | 800° C. | 900° °C. | 1000° C. | 1100° C. | 1200° C. | 1300° C. | 1400° C. | 1500° C. | 1600° C. | 1700° C. | 1800° C. |
|---|---|---|---|---|---|---|---|---|---|---|---|---|---|---|
| LOW PRESSURE ATMOSPHERE | FLUORINE | 1.00 | 0.80 | 0.50 | 0.40 | 0.30 | 0.20 | — | — | — | — | — | — | — |
| | CHLORINE | 0.95 | 0.50 | 0.30 | 0.25 | 0.20 | 0.15 | — | — | — | — | — | — | — |
| HYDROGEN ATMOSPHERE | FLUORINE | 1.00 | 0.70 | 0.45 | 0.35 | 0.28 | 0.20 | 0.18 | — | — | — | — | — | — |
| | CHLORINE | 0.80 | 0.40 | 0.20 | 0.15 | 0.12 | 0.10 | 0.10 | — | — | — | — | — | — |
| HYDROGEN/ SILANE MIXED GAS ATMOSPHERE | FLUORINE | 1.00 | 0.70 | 0.30 | 0.25 | 0.23 | 0.20 | 0.18 | 0.10 | 0.10 | 0.08 | 0.08 | 0.07 | 0.06 |
| | CHLORINE | 0.80 | 0.40 | 0.18 | 0.16 | 0.15 | 0.10 | 0.10 | 0.10 | 0.10 | 0.08 | 0.08 | 0.07 | 0.06 |

Next, a contact hole is opened in the insulating film 9 and the contact electrode 12 is formed. The contact electrode 12 is in contact with the n-type silicon carbide layer 1 and the p-type ion implant layer 4, via the contact hole opened in the insulating film 9. On the contact electrode 12, the electrode pad 14 is formed. The structure formed up to here is depicted in FIG. 4.

Next, on the second main surface (the second surface opposite the first main surface on which the n-type silicon carbide layer 1 is formed) of the n$^+$-type silicon carbide semiconductor substrate 100, the rear electrode 13 and the rear electrode pad 15 are formed, whereby the silicon carbide semiconductor Schottky barrier diode depicted in FIG. 1 is completed.

FIG. 5 is a graph of surface analysis results of the silicon carbide semiconductor device according to the first embodiment. In FIG. 5, a horizontal axis represents depth from the surface of the insulating film 9, where up to a dotted line A is in the insulating film 9 and from the dotted line A is in the n-type silicon carbide layer 1. Further, a vertical axis represents detected amounts of a measured element (atoms/cm$^3$).

For analysis of impurities over the n-type silicon carbide layer 1 from the insulating film 9, Time Of Flight Secondary Ion Mass Spectrometry (TOF-SIMS) was used while etching in a depth direction using argon (Ar) was performed. The TOF-SIMS is a technique of irradiating a solid sample with an ion beam (primary ion), and utilizing time-of-flight differences to separate by mass, ions (secondary ions) emitted from the surface.

A first conventional example in FIG. 5 is an example of a case where the insulating film 9 is formed by a deposition method and the insulating film 9 is formed without removing assumed to be a concentration ($1 \times 10^{17}$ atoms/cm$^3$) below the sensitivity of the TOF-SIMS.

Further, a test in which reverse voltage was continuously applied was performed to evaluate the silicon carbide semiconductor device fabricated according to the first embodiment. Compared to a case in which the process of removing elements such as fluorine was not performed before forming the insulating film 9, the silicon carbide semiconductor device fabricated according to the first embodiment was confirmed to have a low likelihood of leading to destruction.

As described, the silicon carbide semiconductor device according to the first embodiment introduces a process of removing surface-attached fluorine, etc. by cleaning, before the formation of the insulating film. As a result, fluorine and chlorine from inside the insulating film and from the interface of the insulating film and the n-type silicon carbide layer are no longer detected and therefore, do not cause decreases in carrier mobility of the silicon carbide semiconductor device or irregular decreases of the breakdown voltage, whereby it becomes possible to provide a silicon carbide semiconductor device exhibiting favorable long-term reliability.

From the results of the test in which reverse voltage was continuously applied, the silicon carbide semiconductor device according to the first embodiment suppressed device destruction when reverse voltage was applied. Further, a device having a low ON resistance may be obtained, which is a characteristic of a silicon carbide semiconductor device.

Figure 6:
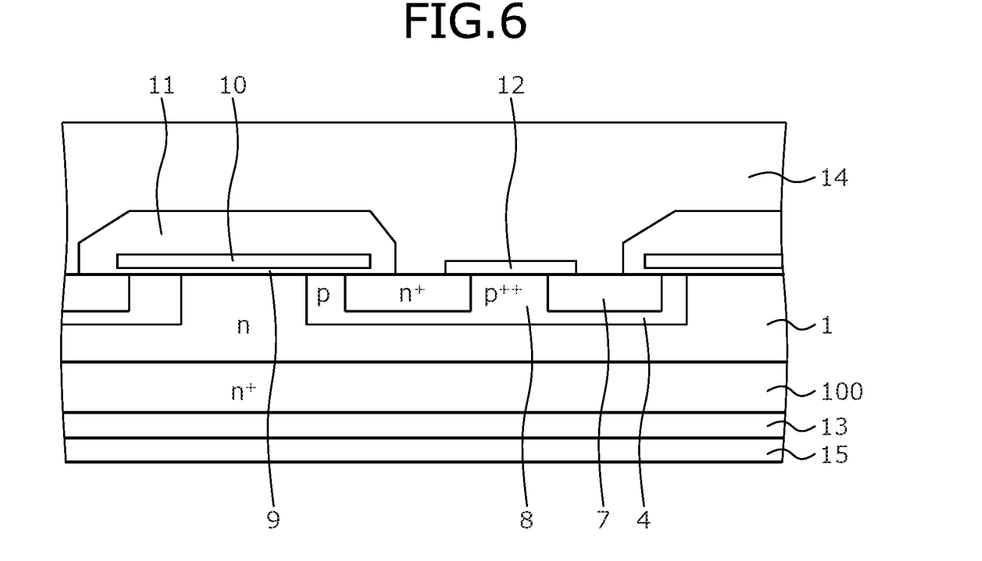
FIG. 6 is a cross-sectional view of the silicon carbide semiconductor device according to a second embodiment.

A second embodiment will be described taking, as an example, a double-implant MOSFET (DI-MOSFET) fabricated by a double implant (DI) process of respectively forming a p-type well region and an n-type source region by ion implantation. FIG. 6 is a cross-sectional view of the silicon carbide semiconductor device according to the second embodiment.

As depicted in FIG. 6, in the silicon carbide semiconductor device according to the second embodiment, the n-type silicon carbide layer 1 is provided on the first main surface, for example, a (0001) plane (Si face), of the n$^+$-type silicon carbide semiconductor substrate 100. In the first main surface (the first surface of the n-type silicon carbide layer 1 opposite the second surface thereof facing the n$^+$-type silicon carbide semiconductor substrate 100) of the n-type silicon carbide layer 1, the p-type ion implant layer ((p-type base region), (second silicon carbide layer of a second conductivity type)) 4 is selectively provided. In the p-type ion implant layer 4, an n$^+$-type source region 7 and a p$^{++}$-type contact region 8 are selectively provided. Further, in an outer periphery of the device, an edge termination structure region (not depicted) is provided.

On the surface of the n-type silicon carbide layer 1, the insulating film 9 (gate insulating film) is provided. By a method similar to the method of the first embodiment, impurities are removed and therefore, neither fluorine nor chlorine is detected from inside the insulating film 9, or from the boundary layer of the insulating film 9 and the n-type silicon carbide layer 1, or from the surface of the n-type silicon carbide layer 1 where the insulating film 9 is provided.

Further, a gate electrode 10 is provided in a region spanning between adjacent p-type ion implant layers 4, and an interlayer insulating film 11 is provided on the gate electrode 10, the n$^+$-type source region 7, and the p-type ion implant layers 4. An opening of the interlayer insulating film 11 is provided on the n$^+$-type source region 7 and the p$^{++}$-type contact region 8. An opening of the interlayer insulating film 11 is further provided in a junction (not depicted) of the gate electrode 10 and the electrode pad 14.

In the opening of the interlayer insulating film 11, the contact electrode 12 is provided on the n$^+$-type source region 7 and the p$^{++}$-type contact region 8. The electrode pad 14 is provided so as to cover the contact electrode 12. Further, the electrode pad 14 is further provided on a junction of the gate electrode 10 and the electrode pad 14, and voltage is applied separated to the contact electrode 12 and the gate electrode 10. On the rear surface of the n$^+$-type silicon carbide semiconductor substrate 100, the rear electrode (drain electrode) 13 and the rear electrode pad 15 are provided.

Figure 7:
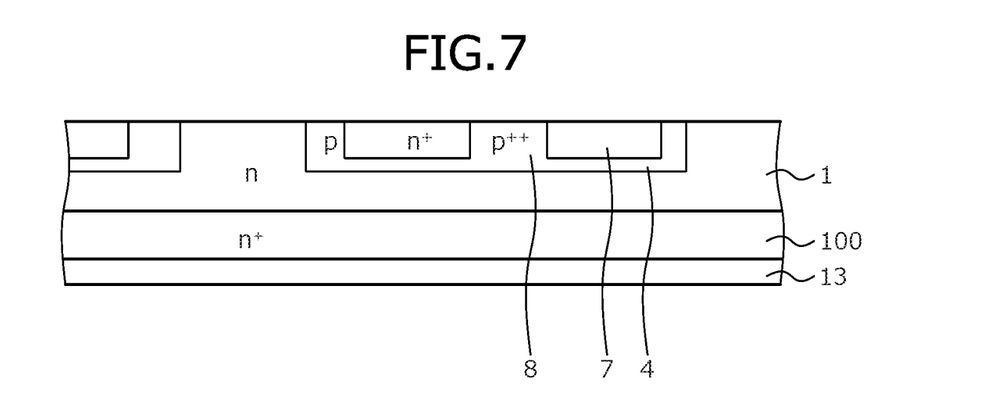
FIGS. 7, 8, and 9 are cross-sectional views of the silicon carbide semiconductor device according to the second embodiment during manufacture.
Figure 8:
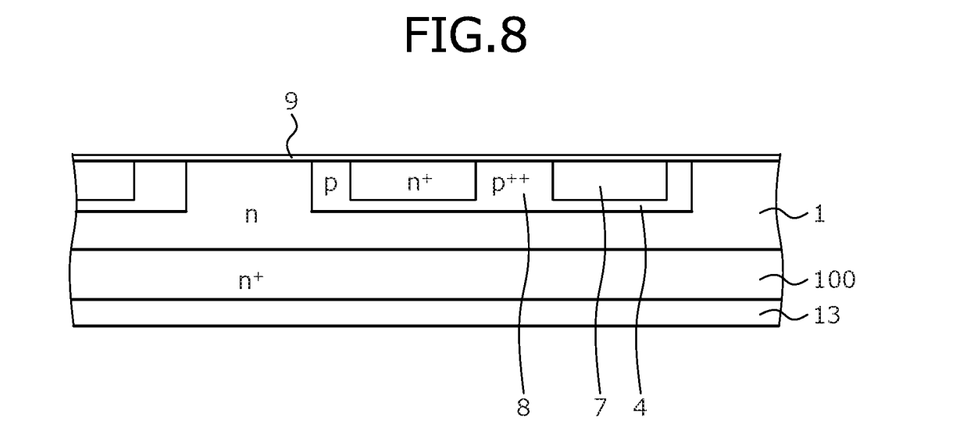
Figure 9:
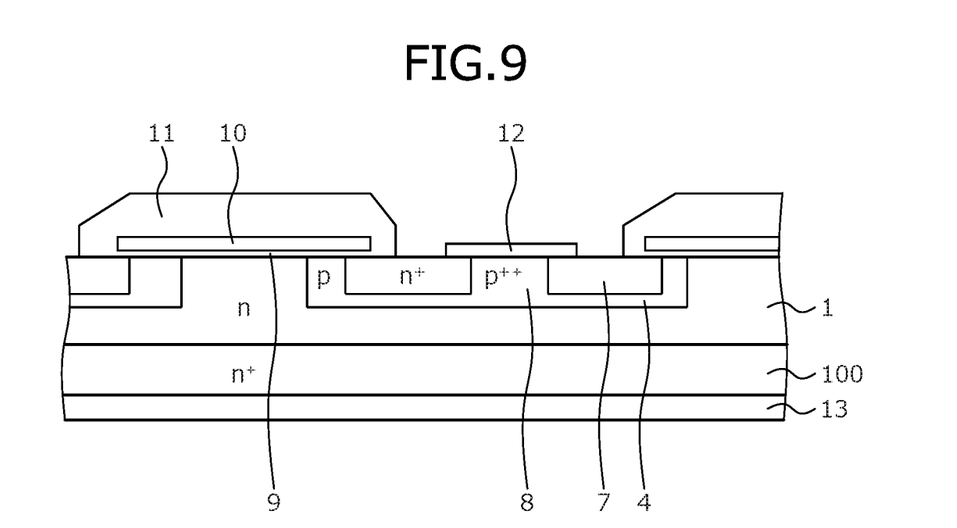

The method of manufacturing a silicon carbide semiconductor device according to the second embodiment will be described taking, as an example, a case in which a DIMOSFET is fabricated. FIGS. 7, 8, and 9 are cross-sectional views of the silicon carbide semiconductor device according to the second embodiment during manufacture. First, the n$^+$-type silicon carbide semiconductor substrate 100 doped with nitrogen is prepared. Next, the n-type silicon carbide layer 1 doped with nitrogen is formed on the n$^+$-type silicon carbide semiconductor substrate 100 by epitaxial growth.

Next, an oxide film mask for ion implantation is formed by photolithography and etching, and the p-type ion implant layer 4 is selectively formed in the surface layer of the n-type silicon carbide layer 1 by ion implantation. Next, an oxide film mask for ion implantation is formed by photolithography and etching, and the n$^+$-type source region 7 and the p$^{++}$-type contact region 8 are selectively formed in the surface layer of the p-type ion implant layer 4 by ion implantation. In the ion implantation, the n-type region is formed by implanting phosphorus ions or nitrogen ions, and the p-type region is formed by implanting aluminum ions. Further, in an outer periphery of the device, the edge termination structure region (not depicted) is formed. The structure formed up to here is depicted in FIG. 7.

Next, after the ion implantation mask is removed, activation annealing is performed at a temperature of about 1700 degrees C. in an inert atmosphere containing, for example, argon. Next, a sacrificial oxide film (not depicted) is formed and the sacrificial oxide film is removed by hydrofluoric acid, whereby a damage layer and impurities such as metal on the surface of the n-type silicon carbide layer 1 are removed. Subsequently, the RCA cleaning is performed and thereafter, by a method similar to the method of the first embodiment, silicon carbide surface impurities are removed, and the insulating film 9 is grown by thermal oxidation on the surface of the n-type silicon carbide layer 1. The structure formed up to here is depicted in FIG. 8.

Next, a poly-silicon film is formed by chemical vapor deposition (CVD), and by a photolithography process, the gate electrode 10 is formed in the region spanning between adjacent p-type ion implant layers 4. Although a silicon oxide film pattern may be formed in advance in a region not requiring the insulating film 9 such as on the edge termination structure region, etc., in such cases as well, similarly as described above, before the silicon oxide film is formed, the process of removing impurities is performed.

Next, the interlayer insulating film 11 constituting the silicon oxide film is formed by CVD, and the opening of the interlayer insulating film 11 is formed on the n$^+$-type source region 7 and the p$^{++}$-type contact region 8 by photolithography. Further, the opening of the interlayer insulating film 11 is further formed at the junction (not depicted) of the gate electrode 10 and the electrode pad 14.

Next, a Ni film, etc. is formed by sputtering, and a pattern is formed on the n$^+$-type source region 7 and the p$^{++}$-type contact region 8 by a photolithography process. The Ni film, etc. is heated by rapid thermal annealing (RTA) at a temperature of about 1000 degrees C. in an inert gas atmosphere or a reduced-pressure atmosphere, forming the contact electrode 12. The structure formed up to here is depicted in FIG. 9.

Next, the electrode pad 14 containing Al and having a thickness of about 5 μm is formed so as to cover the contact electrode 12. The electrode pad 14 is further formed on the junction of the gate electrode 10 and the electrode pad 14, and voltage is applied separately to the contact electrode 12 and the gate electrode 10. On the rear surface of the n$^+$-type silicon carbide semiconductor substrate 100, the rear electrode (drain electrode) 13 and the rear electrode pad 15 are formed, whereby the silicon carbide semiconductor device (DIMOSFET) depicted in FIG. 6 is formed.

To evaluate the silicon carbide semiconductor device fabricated according to the second embodiment, forward ON resistance was evaluated. Compared to a case in which the process of removing elements such as fluorine was not performed before forming the insulating film 9, the silicon carbide semiconductor device fabricated according to the second embodiment was confirmed to have a low likelihood of leading to destruction.

As described, the semiconductor device according to the second embodiment, similarly to the first embodiment, introduces a process of removing surface-attached fluorine, etc. by cleaning, before the formation of the insulating film. As a result, effects similar to those of the first embodiment are obtained. Further, since silicon carbide surface impurities are removed, it becomes possible to reduce the forward ON resistance.

Figure 10:
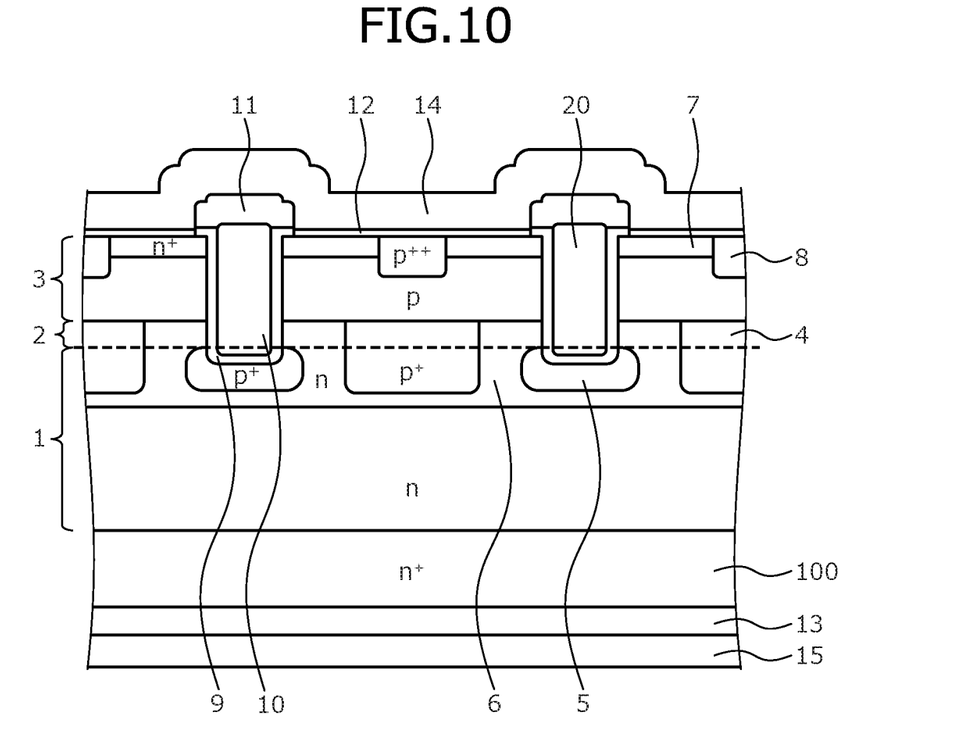
FIG. 10 is a cross-sectional view of the silicon carbide semiconductor device according to a third embodiment.

A third embodiment will be described taking, as an example, a silicon carbide semiconductor device having a trench structure. FIG. 10 is a cross-sectional view of the silicon carbide semiconductor device according to the third embodiment.

As depicted in FIG. 10, in the silicon carbide semiconductor device according to the third embodiment, the n-type silicon carbide layer 1 (first n-type silicon carbide layer) is provided on the first main surface, for example, a (0001) plane (Si face), of the $n^+$-type silicon carbide semiconductor substrate 100. The $n^+$-type silicon carbide semiconductor substrate 100 is a silicon carbide single-crystal substrate doped with an n-type impurity such as nitrogen. The n-type silicon carbide layer 1 is a low-concentration n-type drift layer doped with an n-type impurity such as nitrogen. An impurity concentration of the n-type silicon carbide layer 1 is lower than an impurity concentration of the $n^+$-type silicon carbide semiconductor substrate 100. A thickness of the n-type silicon carbide layer 1 varies according to the device breakdown voltage and a thickness from about 3 μm to 100 μm is used.

In the first main surface (the first surface of the n-type silicon carbide layer 1 opposite the second surface thereof facing the $n^+$-type silicon carbide semiconductor substrate 100 of the n-type silicon carbide layer 1), a second n-type silicon carbide layer 2 is provided. The second n-type silicon carbide layer 2 is a low-concentration n-type drift layer. An impurity concentration of the second n-type silicon carbide layer 2 is equal to the impurity concentration of the n-type silicon carbide layer 1 and therefore, is doped with an n-type impurity such as nitrogen. A thickness of the second n-type silicon carbide layer 2 may be a thickness sufficient to become a current path and a thickness of about 0.3 μm to 0.7 μm is used.

In the n-type silicon carbide layer 1 and the second n-type silicon carbide layer 2, the p-type ion implant layer ($p^+$-type base region) 4 is provided. In the n-type silicon carbide layer 1, a $p^+$-type ion implant region 5 positioned at a bottom of a trench 20 described hereinafter is formed. Further, in a region constituting a current path of a periphery of the p-type ion implant layer 4 and the $p^+$-type ion implant region 5, an n-type ion implantation layer 6 may be provided. An impurity concentration of the n-type ion implantation layer 6 is lower than the impurity concentration of the $n^+$-type silicon carbide semiconductor substrate 100 and higher than the impurity concentration of the n-type silicon carbide layer 1.

On a first main surface (first surface of the second n-type silicon carbide layer 2 opposite a second surface thereof, the second surface facing toward the $n^+$-type silicon carbide semiconductor substrate 100) of the second n-type silicon carbide layer 2, a p-type silicon carbide layer (third silicon carbide layer of the second conductivity) 3 is provided. The p-type silicon carbide layer 3 is, for example, a p-type layer doped with aluminum (Al) and provided to have a thickness of about 0.5 μm to 2.0 μm. The p-type silicon carbide layer 3 functions as a channel of the trench-type MOSFET.

On a first main surface of the p-type silicon carbide layer 3, the $n^+$-type source region 7 and the $p^{++}$-type contact region 8 are provided. The $n^+$-type source region 7 and the $p^{++}$-type contact region 8 are in contact with each other. Further, the trench 20 is provided in the p-type silicon carbide layer 3. The trench 20 reaches at least the second n-type silicon carbide layer 2 from a first main surface (a first surface of the p-type silicon carbide layer 3 opposite a second surface thereof, the second surface facing toward the $n^+$-type silicon carbide semiconductor substrate 100) of the p-type silicon carbide layer 3. Further, the bottom of the trench 20 is in contact with the $p^+$-type ion implant region 5 formed in the n-type silicon carbide layer 1, or is near the $p^+$-type ion implant region 5. The bottom and a side surface of the trench 20 may have a continuous, curved surface formed by an annealing method, whereby local concentrations of electric field may be suppressed.

The insulating film 9 (gate insulating film) is provided along a surface of the trench 20. By a method similar to the method of the first embodiment, impurities are removed and therefore, neither fluorine nor chlorine is detected from inside the insulating film 9, or from a boundary layer of the insulating film 9 and the second n-type silicon carbide layer 2, or from the surface of the second n-type silicon carbide layer 2 where the insulating film 9 is provided. Further, the gate electrode 10, which is insulated from the periphery by the insulating film 9, is provided in the trench 20. A part of the gate electrode 10 may protrude outside the trench 20.

The interlayer insulating film 11 is provided so as to cover the gate electrode 10 embedded in the trench 20, on the entire first main surface side of the p-type silicon carbide layer 3. A contact electrode (source electrode) 12 that is in contact with the $n^+$-type source region 7 and the $p^{++}$-type contact region 8 via a contact hole opened in the interlayer insulating film 11 is provided. The contact electrode 12 is electrically insulated from the gate electrode 10 by the interlayer insulating film 11. The electrode pad 14 is provided on the contact electrode 12.

On the second main surface (the second surface opposite the first main surface on which the n-type silicon carbide layer 1 is formed) of the $n^+$-type silicon carbide semiconductor substrate 100, the rear electrode (drain electrode) 13 and the rear electrode pad (drain electrode pad) 15 are provided.

The method of manufacturing a silicon carbide semiconductor device according to the third embodiment will be described, taking as an example, a case in which trench-type silicon carbide semiconductor device is fabricated. FIGS. 11, 12, 13, 14, and 15 are cross-sectional views of the silicon carbide semiconductor device according to the third embodiment during manufacture. First, the $n^+$-type silicon carbide semiconductor substrate 100 doped with nitrogen is prepared. Next, the n-type silicon carbide layer 1 doped with nitrogen is formed on the $n^+$-type silicon carbide semiconductor substrate 100 by epitaxial growth.

Figure 11:
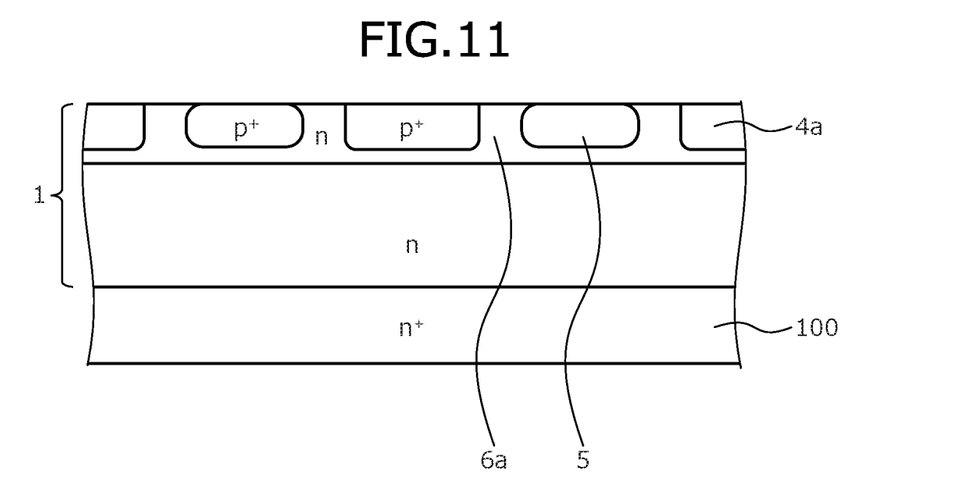
FIGS. 11, 12, 13, 14, and 15 are cross-sectional views of the silicon carbide semiconductor device according to the third embodiment during manufacture.

Next, in the first main surface (the first surface of the n-type silicon carbide layer 1 opposite the second surface thereof facing the $n^+$-type silicon carbide semiconductor substrate 100) of the n-type silicon carbide layer 1, a lower $p^+$-type base region 4a constituting the p-type ion implant layer 4 and the $p^+$-type ion implant region 5 positioned at the bottom of the trench 20 are formed. Ion implantation depths of the lower $p^+$-type base region 4a and the $p^+$-type ion implant region 5 may be at maximum about 0.7 μm, which enables recovery of crystal defects by heat treatment. The impurity concentrations of the lower $p^+$-type base region 4a and the $p^+$-type ion implant region 5 is formed to be about $5\times10^{17}$ to $1\times10^{19}$/cm$^3$. Next, in a region constituting a current path of a periphery of the lower $p^+$-type base region 4a and the $p^+$-type ion implant region 5, a lower n-type ion implantation layer 6a is formed. An impurity concentration of the lower n-type ion implantation layer 6a is lower than the impurity concentration of the $n^+$-type silicon carbide semiconductor substrate 100 and higher than the impurity concentration of the n-type silicon carbide layer 1. The structure formed up to here is depicted in FIG. 11.

Figure 12:
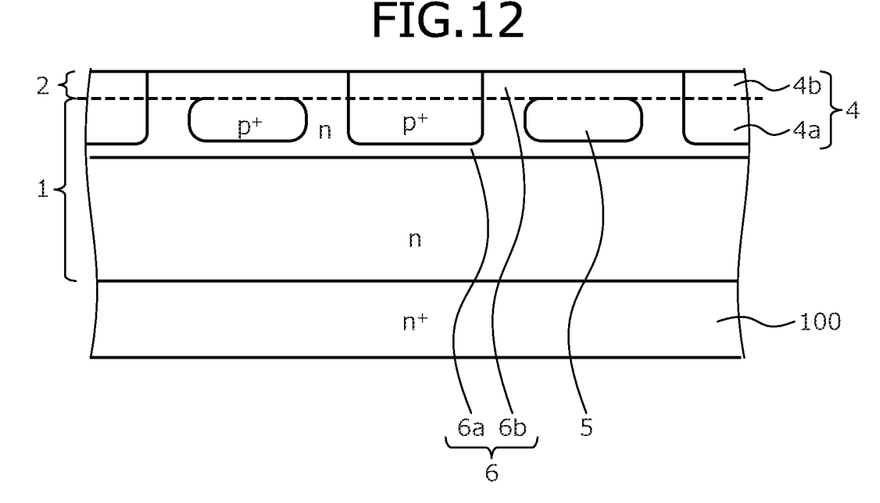

On the first main surface (the first surface of the n-type silicon carbide layer 1 opposite the second surface thereof facing the $n^+$-type silicon carbide semiconductor substrate 100) of the n-type silicon carbide layer 1, the second n-type silicon carbide layer 2 is formed. Next, in the first main surface (the first surface of the second n-type silicon carbide layer 2 opposite the second surface thereof facing toward the n$^+$-type silicon carbide semiconductor substrate 100) of the second n-type silicon carbide layer 2, an upper p$^+$-type base region 4b is formed in a region continuous with the lower p$^+$-type base region 4a formed in the n-type silicon carbide layer 1. The region formed by the lower p$^+$-type base region 4a and the upper p$^+$-type base region 4b is indicated as the p-type ion implant layer 4. Here, an impurity concentration of the upper p$^+$-type base region 4b is formed to be about $5\times10^{17}$ to $1\times10^{19}/cm^3$, equal to the impurity concentration of the lower p$^+$-type base region 4a.

Next, an upper n-type ion implantation layer 6b may be formed in a part that constitutes the current path of the periphery of the p-type ion implant layer 4 and that is in contact with the lower n-type ion implantation layer 6a formed on the n-type silicon carbide layer 1. An impurity concentration of the upper n-type ion implantation layer 6b is lower than the impurity concentration of the n$^+$-type silicon carbide semiconductor substrate 100 and higher than the impurity concentration of the n-type silicon carbide layer 1. The region formed by the lower n-type ion implantation layer 6a and the upper n-type ion implantation layer 6b is indicated as the n-type ion implantation layer 6. The structure formed up to here is depicted in FIG. 12.

Figure 13:
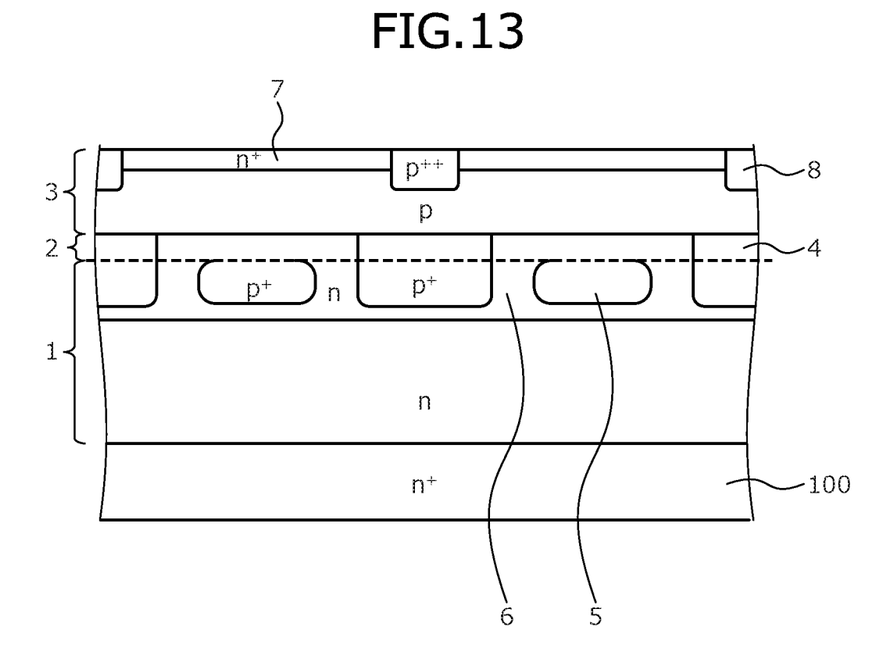

Next, on the first main surface (the first surface of the second n-type silicon carbide layer 2 opposite the second surface thereof facing toward the n$^+$-type silicon carbide semiconductor substrate 100) of the second n-type silicon carbide layer 2, the p-type silicon carbide layer 3 is formed. The p-type silicon carbide layer 3 is formed by doping, for example, aluminum (Al) to about $5\times10^{16}$ to $1\times10^{18}/cm^3$. Next, in the first main surface of the p-type silicon carbide layer 3, the n$^+$-type source region 7 and the p$^{++}$-type contact region 8 are formed so as to be in contact with each other. The structure formed up to here is depicted in FIG. 13.

Next, the trench 20 is formed to reach at least the second n-type silicon carbide layer 2 from a first main surface (first surface of the p-type silicon carbide layer 3 opposite a second surface thereof, the second surface facing toward the n$^+$-type silicon carbide semiconductor substrate 100) of the p-type silicon carbide layer 3. Next, a sacrificial oxide film (not depicted) is formed and the sacrificial oxide film is removed by hydrofluoric acid, whereby a damage layer and impurities such as metal on the trench surface are removed. Subsequently, after the RCA cleaning is performed, silicon carbide surface impurities are removed by a method similar to the method of the first embodiment.

Figure 14:
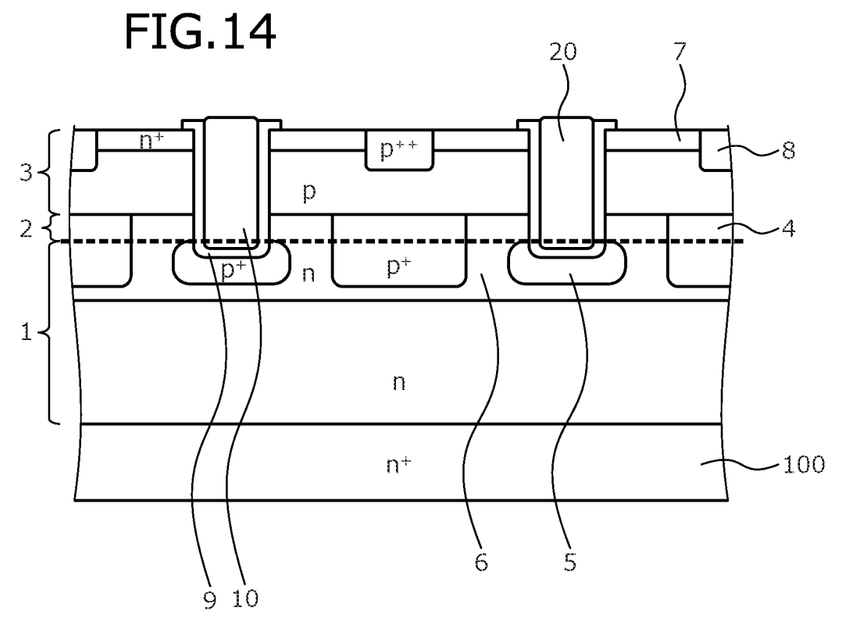

Next, the insulating film 9 is formed along the surface of the trench 20 by a deposition method. Next, the gate electrode 10, which is insulated from the periphery by the insulating film 9, is formed in the trench 20. A part of the gate electrode 10 may protrude outside the trench 20. The structure formed up to here is depicted in FIG. 14.

Figure 15:
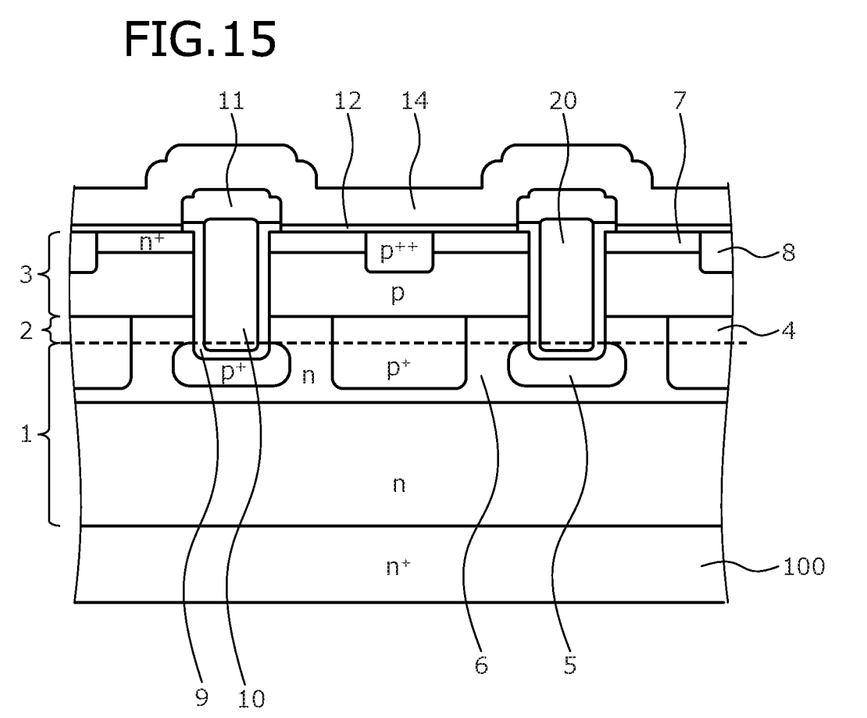

Next, the interlayer insulating film 11 is formed so as to cover the gate electrode 10 embedded in the trench 20, on the entire first main surface side of the p-type silicon carbide layer 3. Next, the contact electrode (source electrode) 12 that is in contact with the n$^+$-type source region 7 and the p$^{++}$-type contact region 8 via a contact hole opened in the interlayer insulating film 11 is formed. Next, the electrode pad 14 is formed on the contact electrode 12. The structure formed up to here is depicted in FIG. 15.

Next, on the second main surface (the second surface opposite the first main surface on which the n-type silicon carbide layer 1 is formed) of the n$^+$-type silicon carbide semiconductor substrate 100, the rear electrode (drain electrode) 13 and the rear electrode pad (drain electrode pad) 15 are formed, whereby the trench-type silicon carbide semiconductor device depicted in FIG. 10 is completed.

To evaluate the silicon carbide semiconductor device fabricated according to the third embodiment, forward ON resistance at a current value of 25 mA was evaluated. The results are depicted in Table 2.

TABLE 2

| PREPROCESSING METHOD | ON RESISTANCE |
| --- | --- |
| NONE | 1 |
| LOW PRESSURE ATMOSPHERE 800° C. 30 MIN. | 0.95 |
| HYDROGEN ATMOSPHERE 800° C. 30 MIN. | 0.90 |
| HYDROGEN/SILANE MIXED GAS ATMOSPHERE 1400° C. 30 MIN. | 0.85 |

As depicted in Table 2, the device ON resistance is assumed to be 1 in a case where the process of removing elements such as fluorine is not performed before the formation of the insulating film 9. Here, it was confirmed the silicon carbide semiconductor device fabricated by performing the preprocessing as in the second embodiment, etc. tended to have a lower ON resistance.

As described, the semiconductor device according to the third embodiment introduces a process of removing surface-attached fluorine, etc. by cleaning, before the formation of the insulating film. As a result, effects similar to those of the first embodiment are obtained. Further, since silicon carbide surface impurities are removed, it becomes possible to reduce the forward ON resistance. In addition, in the third embodiment, since the device has a trench structure, a device having a low ON resistance may be realized.

The present invention may be variously modified within a scope not deviating from the spirit of the invention. For example, in the embodiments above, dimensions, impurity concentrations, etc. may be variously set according to required specifications. For example, in the embodiments, although an example is described taking a case in which a main surface of the silicon carbide semiconductor substrate containing silicon carbide is a (0001) plane and on the (0001) plane, a MOS is configured, without limitation hereto, by changing the method of manufacture, various changes are possible such as the wide bandgap semiconductor material, the orientation of the substrate main surface, etc. Further, in the embodiments above, although an example is described taking a case in which silicon carbide is used as a wide bandgap semiconductor material, a wide bandgap semiconductor material other than silicon carbide such as, for example, gallium nitride (GaN) or the like may be used. Further, in the embodiments above, although the first conductivity type is an n-type and the second conductivity type is a p-type, the present invention is similarly implemented when the first conductivity type is a p-type and the second conductivity type is an n-type.

As described, according to the embodiments of the invention, the process of removing surface-attached fluorine, etc. by cleaning, is introduced before the formation of the insulating film. As a result, fluorine and chlorine are no longer detected from inside the insulating film, or from the interface of the insulating film and the n-type silicon carbide layer (first silicon carbide layer of the first conductivity type) and therefore, do not cause decreases in carrier mobility of the silicon carbide semiconductor device or irregular decreases of the breakdown voltage, whereby it becomes possible to provide a silicon carbide semiconductor device exhibiting favorable long-term reliability.

The silicon carbide semiconductor device and the method of manufacturing a silicon carbide semiconductor device according the present invention achieve an effect in that impurities are suppressed from being mixed in the channel region, enabling stabilization of the breakdown voltage without decreases in carrier mobility.

As described, the silicon carbide semiconductor device and the method of manufacturing a silicon carbide semiconductor device according to the present invention are useful for high-voltage semiconductor devices used in power converting equipment and in power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
   a silicon carbide semiconductor substrate of a first conductivity type, having a front surface;
   a first silicon carbide layer of the first conductivity type provided on the front surface of the substrate, the first silicon carbide layer having a first surface, and a second surface opposite to the first surface and facing the front surface of the substrate;
   a second silicon carbide layer of the first conductivity type selectively provided in the first surface of the first silicon carbide layer, the second silicon carbide layer having a first surface, and a second surface opposite to the first surface and facing the first surface of the first silicon carbide layer;
   a third silicon carbide layer of a second conductivity selectively provided on the first surface of the second silicon carbide layer, the third silicon carbide layer having a first surface, and a second surface opposite to the first surface and facing the first surface of the second silicon carbide layer;
   a trench at least penetrating the third silicon carbide layer and reaching the second silicon carbide layer; and
   a gate insulating film provided on a surface of the trench, the gate insulating film having a first surface, and a second surface opposite to the first surface and facing the trench, a part of the first surface facing the second silicon carbide layer, wherein
   fluorine and chlorine are both undetectable
      in the gate insulating film,
      at a boundary between the first surface of the gate insulating film and the second silicon carbide layer, or
      at a boundary between the trench and the second surface of the gate insulating film.

2. The silicon carbide semiconductor device according to claim 1, wherein
   fluorine and chlorine are both undetectable means a converted concentration of fluorine and chlorine is less than $1\times10^{17}$ atoms/cm$^3$.

3. The silicon carbide semiconductor device according to claim 1, wherein
   fluorine and chlorine are both undetectable means a converted concentration of fluorine and chlorine by Time Of Flight Secondary Ion Mass Spectrometry is less than $1\times10^{17}$ atoms/cm$^3$.

4. The silicon carbide semiconductor device according to claim 1, wherein
   fluorine and chlorine are both undetectable in the gate insulating film,
   at a boundary between the first surface of the gate insulating film and the second silicon carbide layer, and
   at a boundary between the trench and the second surface of the gate insulating film.

5. The silicon carbide semiconductor device according to claim 1, wherein
   fluorine and chlorine are both undetectable at the first and second surfaces and inside of the insulating film.

* * * * *